(12) United States Patent
Cho et al.

(10) Patent No.: US 8,288,203 B2
(45) Date of Patent: Oct. 16, 2012

(54) SEMICONDUCTOR DEVICE AND METHOD OF FORMING A WAFER LEVEL PACKAGE STRUCTURE USING CONDUCTIVE VIA AND EXPOSED BUMP

(75) Inventors: SungWon Cho, Kyoung-gi-Do (KR); JoonYoung Choi, Kyoung-ki-do (KR); DaeSik Choi, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 56 days.

(21) Appl. No.: 13/035,617

(22) Filed: Feb. 25, 2011

(65) Prior Publication Data

US 2012/0217629 A1    Aug. 30, 2012

(51) Int. Cl.
*H01L 21/00*    (2006.01)
(52) U.S. Cl. ............. 438/107; 257/784; 257/E21.499
(58) Field of Classification Search .......... 438/55, 438/106, 107, 113, 124–127; 257/690–693, 257/737, 784, E21.499, E23.011
See application file for complete search history.

(56) References Cited

U.S. PATENT DOCUMENTS

| | | | |
|---|---|---|---|
| 6,344,401 B1 | 2/2002 | Lam | |
| 6,552,426 B2 | 4/2003 | Ishio et al. | |
| 7,807,512 B2 * | 10/2010 | Lee et al. | 438/127 |
| 2008/0272477 A1 | 11/2008 | Do et al. | |

* cited by examiner

*Primary Examiner* — David Vu
(74) *Attorney, Agent, or Firm* — Roberts D. Atkins; Patent Law Group: Atkins & Associates, P.C.

(57) ABSTRACT

A semiconductor device has a carrier. A semiconductor wafer including a semiconductor die is mounted to the carrier with an active surface of the semiconductor die facing away from the carrier. A plurality of bumps is formed over the active surface of the semiconductor die. An opening is formed in a periphery of the semiconductor die. An encapsulant is deposited over the carrier and semiconductor die, in the opening, and around the plurality of bumps such that an exposed portion of the plurality of bumps is devoid of encapsulant. A conductive via is formed through the encapsulant, within the opening, and extends to the carrier. A conductive layer is formed over the encapsulant and electrically connects to the conductive via and the exposed portion of the plurality of bumps. The carrier is removed to expose an end of the conductive via.

20 Claims, 9 Drawing Sheets

SEMICONDUCTOR DEVICE AND METHOD OF FORMING A WAFER LEVEL PACKAGE STRUCTURE USING CONDUCTIVE VIA AND EXPOSED BUMP

FIELD OF THE INVENTION

The present invention relates in general to semiconductor devices and, more particularly, to a semiconductor device and method of forming a wafer level chip scale package (WLCSP) using a conductive via and an exposed bump.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

Most if not all WLCSPs require a z-direction electrical interconnect structure for signal routing and package integration. Conventional WLCSP z-direction electrical interconnect structures exhibit one or more limitations. In one example, a conventional WLCSP contains a flipchip type semiconductor die and encapsulant formed over the die. An interconnect structure is typically formed over, around, and through the semiconductor die and encapsulant for z-direction vertical electrical interconnect. The flipchip semiconductor die is electrically connected to the interconnect structure with bumps or vias. When the vias are formed and plated directly on a pad of the semiconductor die, the semiconductor die pad can be damaged. Furthermore, the encapsulant and bump interconnect makes package stacking difficult to achieve with fine pitch or high input/output (I/O) count electrical interconnect. In addition, wire bond type semiconductor die are also difficult to stack without dramatically increasing package height. The use of underfill material in packaging the semiconductor die also increases package height.

SUMMARY OF THE INVENTION

A need exists for a simple and cost effective WLCSP interconnect structure for applications requiring low profile packaging with vertical package integration and good thermal performance. Accordingly, in one embodiment, the present invention is a method of making a semiconductor device comprising the steps of providing a carrier, forming an adhesive layer over the carrier, mounting a semiconductor wafer including a plurality of semiconductor die to the carrier with an active surface of the plurality of semiconductor die facing away from the carrier, forming a plurality of bumps over the active surface of the plurality of semiconductor die, removing a portion of the semiconductor wafer to form an opening between the plurality of semiconductor die, and depositing an encapsulant over the carrier and plurality of semiconductor die, in the opening, and around the plurality of bumps such that an exposed portion of the plurality of bumps is devoid of encapsulant. The method further includes the steps of forming a via through the encapsulant, within the opening, and extending to the carrier, depositing a conductive material in the via to form a conductive via, forming a conductive layer over the encapsulant and electrically connected to the conductive via and the exposed portion of the plurality of bumps, and removing the carrier to expose an end of the conductive via. The conductive layer has a thickness less than a height of the exposed portion of the plurality of bumps.

In another embodiment, the present invention is a method of making a semiconductor device comprising the steps of providing a carrier, mounting a semiconductor die to the carrier with an active surface of the semiconductor die facing away from the carrier, forming a plurality of bumps over the active surface of the semiconductor die, and depositing an encapsulant over the carrier, semiconductor die, and around the plurality of bumps such that an exposed portion of the plurality of bumps is devoid of encapsulant. The method further includes the steps of forming a via extending through the encapsulant to the carrier, depositing a conductive material in the via to form a conductive via, forming a conductive layer over the encapsulant and electrically connected to the conductive via and the exposed portion of the plurality of bumps, and removing the carrier to expose an end of the conductive via.

In another embodiment, the present invention is a method of making a semiconductor device comprising the steps of providing a semiconductor die, forming a bump over an active surface of the semiconductor die, depositing an encapsulant over the semiconductor die and around the bump such that an exposed portion of the bump is devoid of encapsulant, forming a conductive via that extends through the encapsulant, and forming a conductive layer over the encapsulant and electrically connected to the conductive via and the exposed portion of the bump.

In another embodiment, the present invention is a semiconductor device comprising a semiconductor die and a bump formed over an active surface of the semiconductor die. An encapsulant is deposited over the semiconductor die and around the bump such that an exposed portion of the bump is devoid of encapsulant. A conductive via is formed through the encapsulant. A conductive layer is formed over the encapsulant and electrically connects to the conductive via and the exposed portion of the bump.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
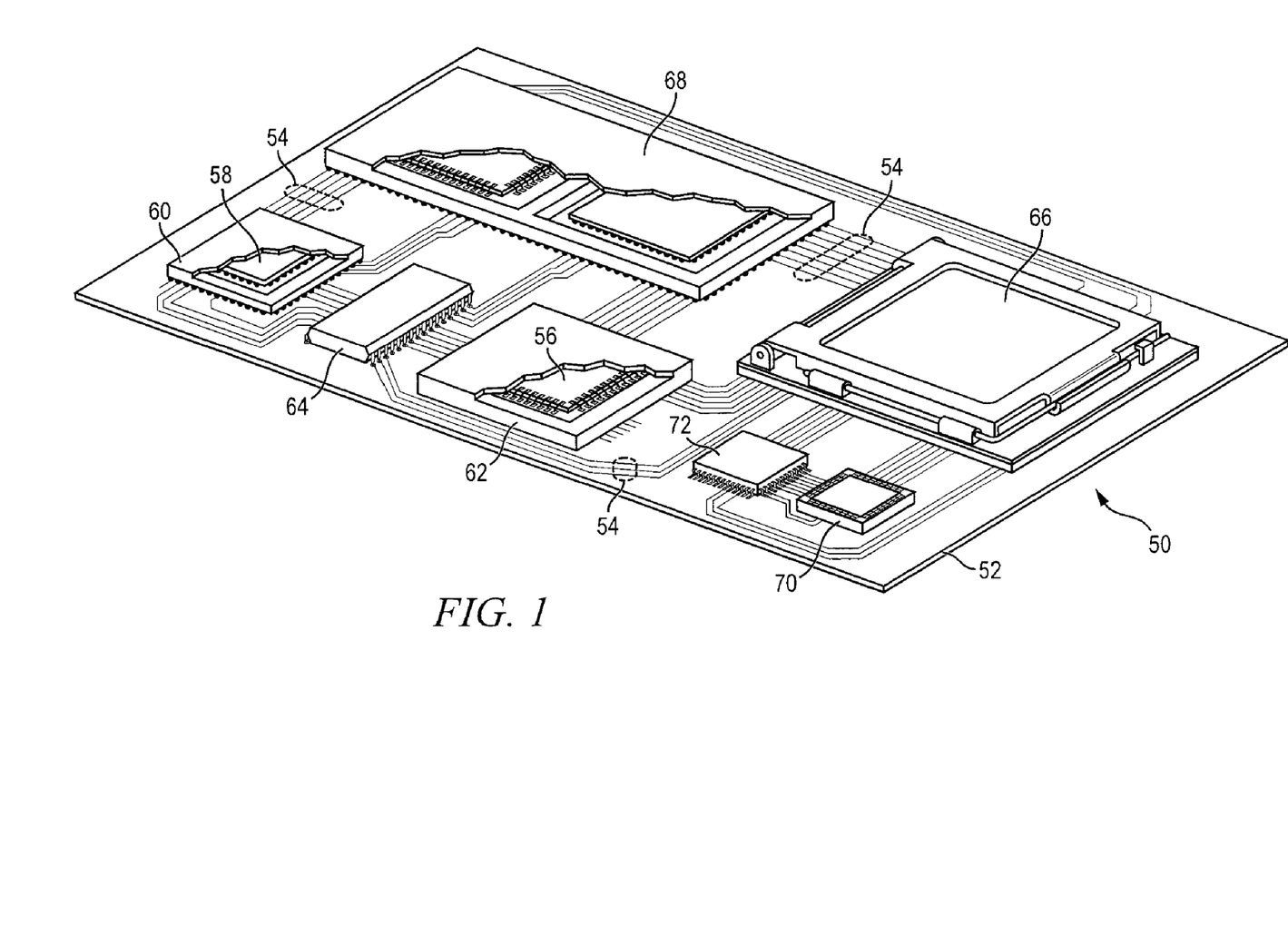
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
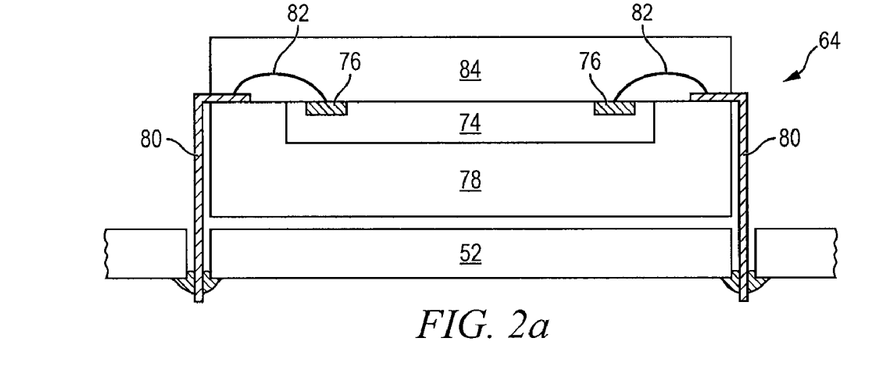
FIGS. 2a-2c illustrate further detail of the semiconductor packages mounted to the PCB.
Figure 2B:
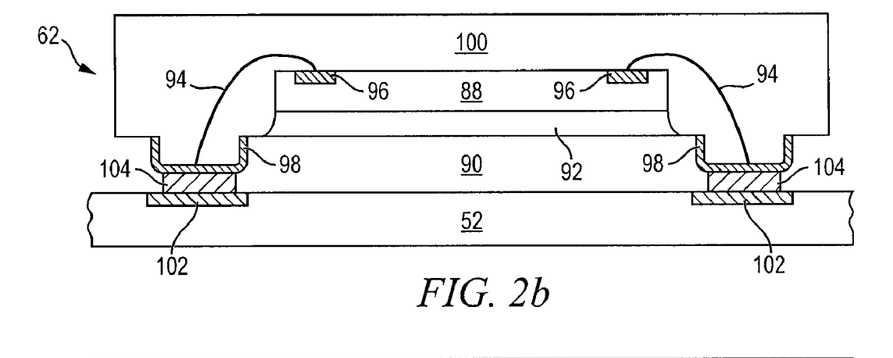
Figure 2C:
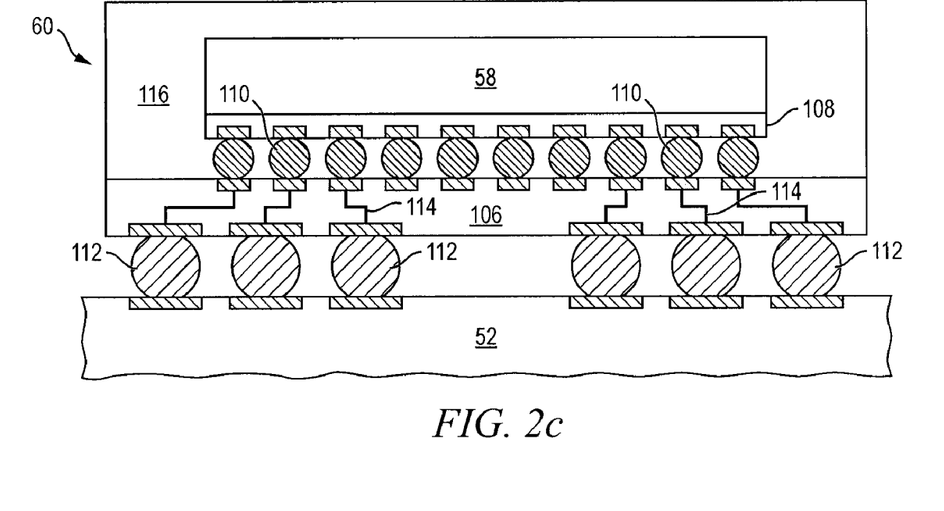

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps

112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
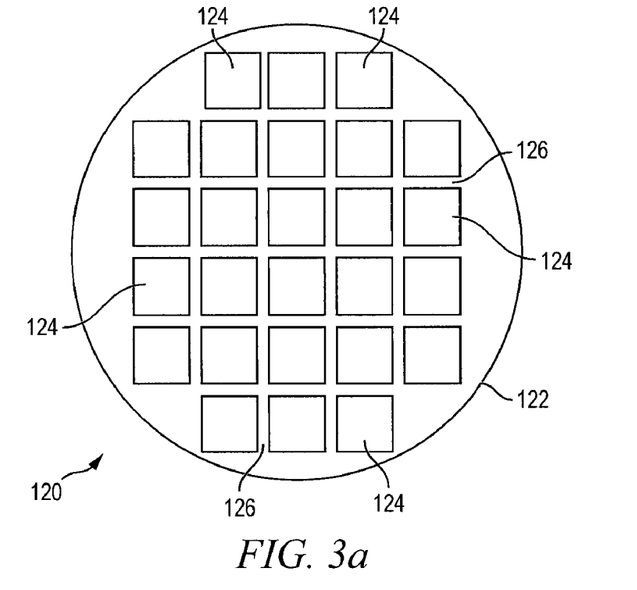
FIGS. 3a and 3b illustrate a semiconductor wafer with a plurality of semiconductor die separated by saw streets.

FIGS. 3a-3b and 4a-4m illustrate, in relation to FIGS. 1 and 2a-2c, a process of forming a WLCSP with an RDL formed over an encapsulant, and a molded laser PoP (MLP) or conductive via formed through the encapsulant. The MLP provides vertical interconnect and electrically connects to bumps partially exposed from the encapsulant. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
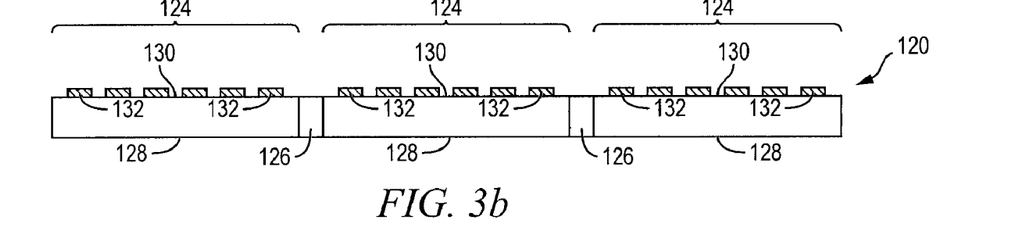

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 130 to implement analog circuits or digital circuits, such as digital signal processor (DSP), ASIC, memory, or other signal processing circuit. Semiconductor die 124 can also contain IPDs, such as inductors, capacitors, and resistors, for RF signal processing. Semiconductor die 124 can also be a flipchip type semiconductor die.

An electrically conductive layer 132 is formed over and extends above active surface 130 such that a top surface of conductive layer 132 creates an uneven surface, and has a non-planar topology, with respect to active surface 130. Alternatively, conductive layer 132 is coplanar with active surface 130. Conductive layer 132 is formed using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 4A:
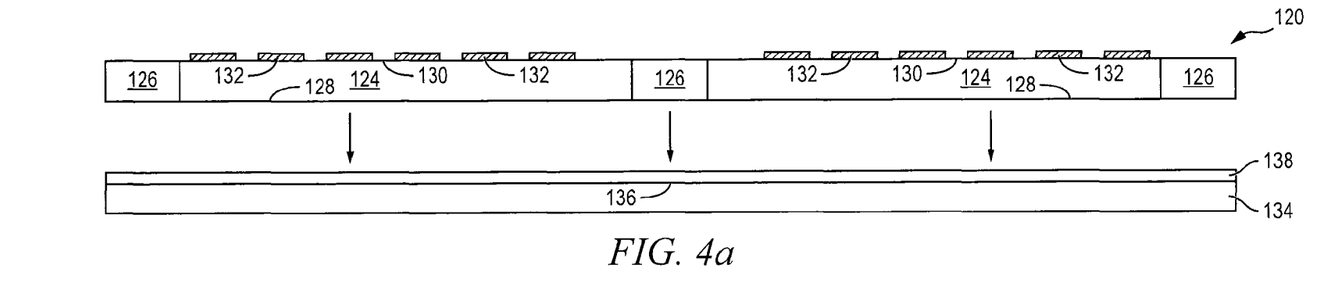
FIGS. 4a-4m illustrate a process of forming WLCSP with conductive via and an exposed bump.

FIG. 4a shows a carrier or substrate 134 containing temporary or sacrificial base material such as silicon, polymer, beryllium oxide, or other suitable low-cost, rigid material for structural support. An interface layer or double-sided tape 138 is formed over a top surface 136 of carrier 134 as an adhesive bonding film or etch-stop layer. Back surface 128 of semiconductor wafer 120 is mounted to interface layer 138 and over carrier 134.

Figure 4B:
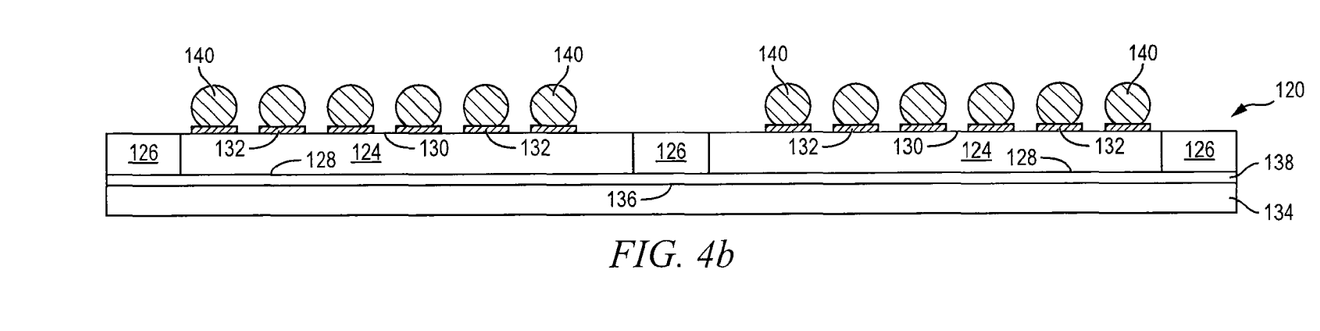

In FIG. 4b, an electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form spherical balls or bumps 140. In some applications, bumps 140 are reflowed a second time to improve electrical contact to conductive layer 132. The bumps can also be compression bonded to conductive layer 132. Bumps 140 represent one type of interconnect structure that can be formed over conductive layer 132. The interconnect structure can also use bond wires, conductive paste, stud bump, micro bump, or other electrical interconnect.

Figure 4C:
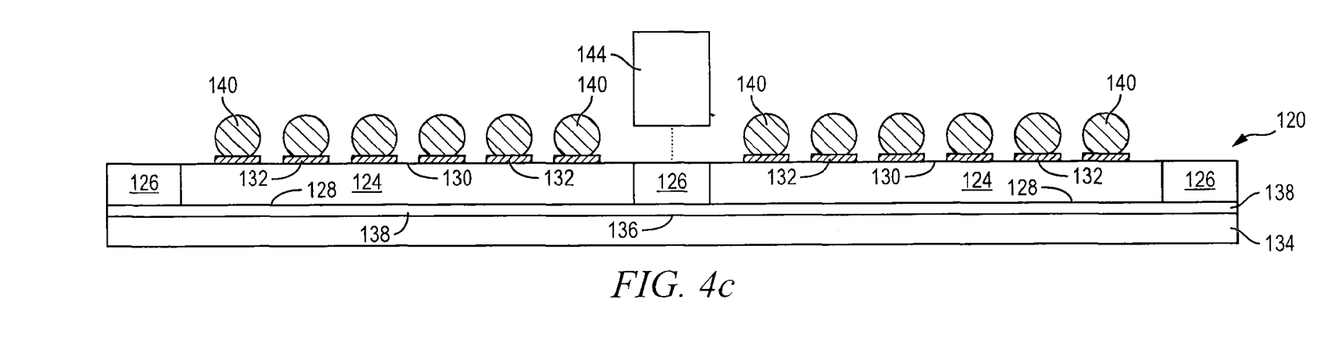

In FIG. 4c, semiconductor wafer 120 is singulated through saw street 126 using a narrow saw blade or laser cutting tool 144. Narrow saw blade or laser cutting tool 144 penetrates to top surface 136 of carrier 134 and removes a portion of interface layer 138, but does not singulate the carrier.

Figure 4D:
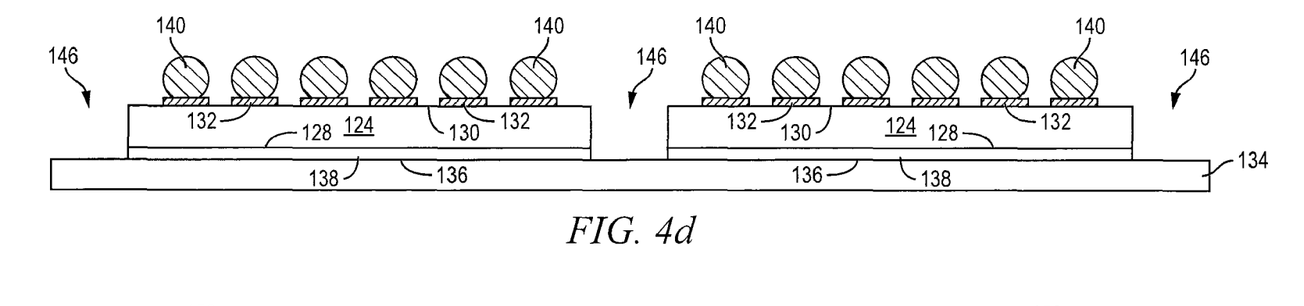

FIG. 4d shows opening 146 in semiconductor wafer 120 remains after saw blade or laser cutting tool 144 has removed a portion of the semiconductor wafer. Opening 146 extends from active surface 130 through semiconductor wafer 120 to back surface 128. Opening 146 also extends to top surface 136 of carrier 134 and includes an area previously occupied by the removed portion of interface layer 138. Opening 146 separates semiconductor wafer 120 into individual semiconductor die 124. In one embodiment, semiconductor die 124 are flipchip type semiconductor die. Alternatively, opening 146 can have an increased width, the opening being formed with a thick bladed saw, an etching saw, a water jet saw, or other suitable sawing or cutting method.

Figure 4E:
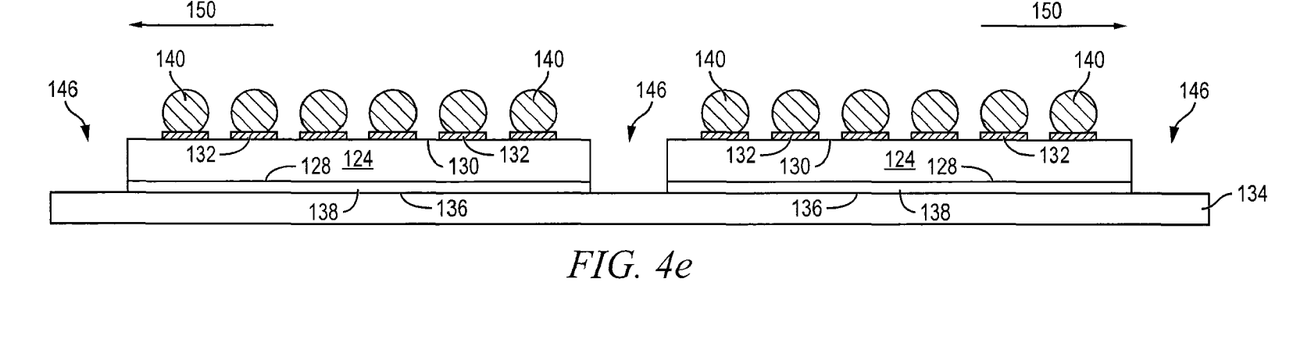
Figure 4F:
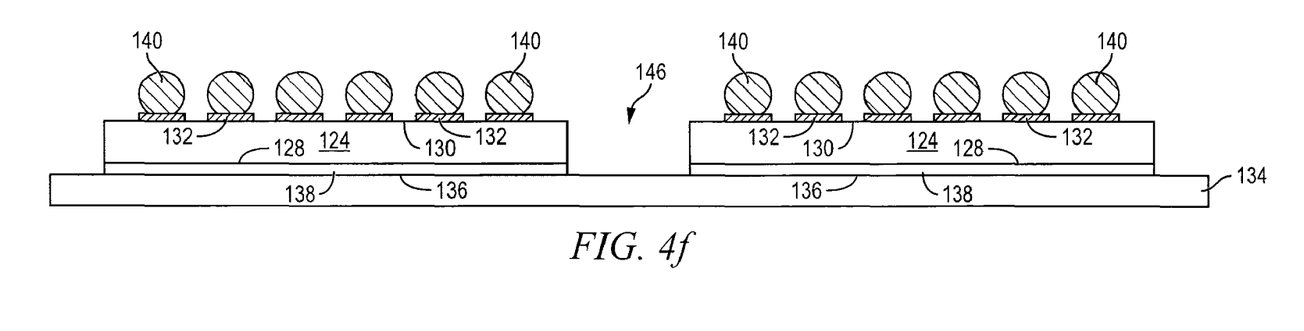

FIGS. 4e and 4f show another method of forming opening 146 with a width greater than 90 micrometers (um) using a narrow saw blade or laser cutting tool. In FIG. 4e, semiconductor wafer 120 is shown with semiconductor die 124 separated by opening 146 that is formed as a narrow opening of less than 90 um. Wafer 120 undergoes a wafer expansion step to increase the width of opening 146. FIG. 4e shows semiconductor die 124 being pulled using a wafer expansion table as shown by directional arrows 150. The expansion table moves in two-dimension lateral directions, as shown by arrows 150, to expand the width of opening 146. The expansion table moves substantially the same distance in the x-axis and y-axis within the tolerance of the table control to provide separation around a periphery of each die.

In FIG. 4f, a width of opening 146 has been increased from a width of less than 90 um to a width greater than or equal to 90 um. As a result, the separation among semiconductor die 124 is increased. Semiconductor die 124 are located farther apart from one another after the expansion than before the expansion.

Figure 4G:
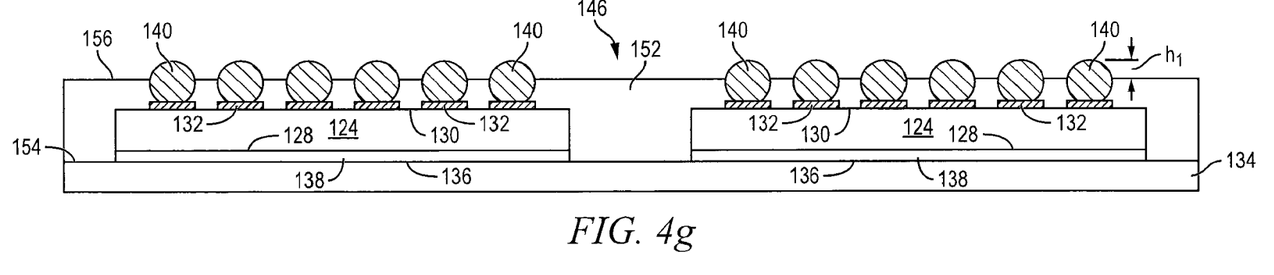

Continuing from FIG. 4d or 4f, FIG. 4g shows an encapsulant or molding compound 152 is deposited over carrier 134, over semiconductor die 124, and within opening 146 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. A first surface 154 of encapsulant 152 contacts top surface 136 of carrier 134, a sidewall of semiconductor die 124, active surface 130 of the semiconductor die, and a portion of conductive layer 132. A second surface 156 of encapsulant 152 is planar, substantially parallel to top surface 136 of carrier 134, and is formed around a portion of bumps 140. Bumps 140 are partially embedded within encapsulant 152, such that a portion of the bumps are devoid of the encapsulant. An end portion of bumps 140 extends to a height of h1 above second surface 156 of encapsulant 152. In one embodiment, h1 is greater than 20 um.

Encapsulant 152 is non-conductive and environmentally protects the semiconductor device from external elements and contaminants. The formation of encapsulant 152 in contact with the sidewalls of semiconductor die 124, and around an active surface 130 of the semiconductor die leaves back surface 128 of the semiconductor die devoid of encapsulant resulting in an exposed flipchip structure. The exposed back surface 128 reduces overall package height as well as produces improved thermal characteristics for the package. By forming encapsulant 152 over active surface 130 and around bumps 140, the need for an additional underfill step is eliminated and the package profile is further reduced.

Figure 4H:
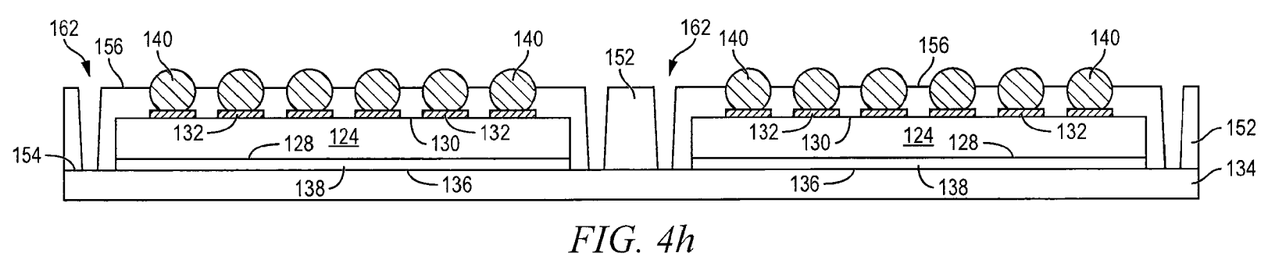

In FIG. 4h, a plurality of vias 162 is formed in encapsulant 152 by deep reactive ion etching (DRIE) or laser drilling process. Vias 162 are formed around a perimeter of semiconductor die 124, and extend from second surface 156 through encapsulant 152 to first surface 154 and expose a portion of carrier 134.

Figure 4I:
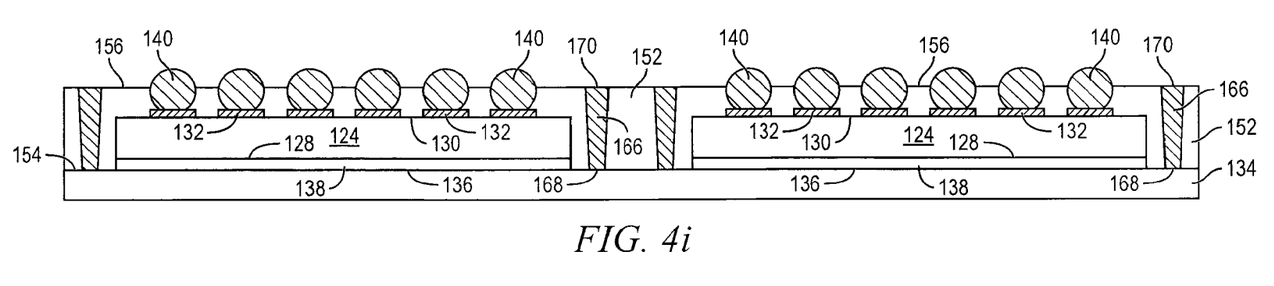

In FIG. 4i, a plurality of conductive vias or MLP 166 is formed by filling the plurality of vias 162 with Al, Cu, Sn, Ni, Au, Ag, titanium (Ti), tungsten (W), poly-silicon, or other suitable electrically conductive material using PVD, CVD, electrolytic plating, electroless plating process, or other suitable metal deposition process. Conductive vias 166 have a first surface 168 in contact with top surface 136 of carrier 134, and a second surface 170 substantially coplanar with second surface 156 of encapsulant 152. Alternatively, a plurality of stud bumps or solder balls can be formed within vias 162. Conductive vias 166 provide electrical vertical interconnect to opposing sides of the later formed WLCSP. Conductive vias 166 provide a reduced package profile by omitting wire bonding which tends to increase package height. Additionally, the formation of conductive vias 166 in encapsulant 152 and not over conductive layer 132 avoids possible damage resulting from forming and plating a conductive via directly on a contact pad of a semiconductor die.

Figure 4J:
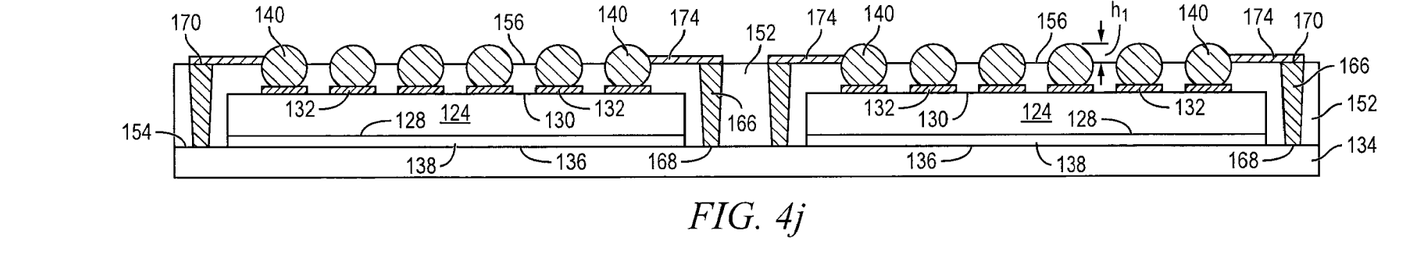

In FIG. 4j, an electrically conductive layer or RDL 174 is conformally applied over conductive vias 166 and encapsulant 152, using a patterning and metal deposition process such as PVD, CVD, sputtering, electrolytic plating, and electroless plating. Conductive layer 174 can be one or more layers of Al, Cu, Sn, Ni, Au, Ag, or other suitable electrically conductive material. Conductive layer 174 can be one or more conductive layers including an adhesion layer, barrier layer, and seed or wetting layer. Conductive layer 174 has a thickness less than a distance between second surface 156 of encapsulant 152 and an end portion of bump 140. Thus, the thickness of conductive layer 174 is less than h1.

Conductive layer 174 electrically connects to second surface 170 of conductive via 166 and to a portion of bumps 140 free from encapsulant 152. Conductive layer 174 can be formed after conductive vias 166 are formed, or alternatively, the conductive layer can be formed with the conductive vias. By indirectly connecting semiconductor die 124 to conductive via 166 through conductive layer 174 and bumps 140, potential damage to conductive layer or contact pad 132 is avoided. While a contact pad on a semiconductor die can be damaged due to directly plating and forming a via on the pad, the formation of conductive via 166 does not occur directly on conductive layer or contact pad 132. Instead, conductive via 166 is formed in encapsulant 152 in a periphery of semiconductor die 124, and electrically connects to the semiconductor die through conductive layer 174 and bumps 140. Thus, the risk of damaging conductive layer 132 in establishing vertical interconnect through the package is reduced by indirectly connecting conductive via 166 to conductive layer 132 through conductive layer 174 and bumps 140.

Figure 4K:
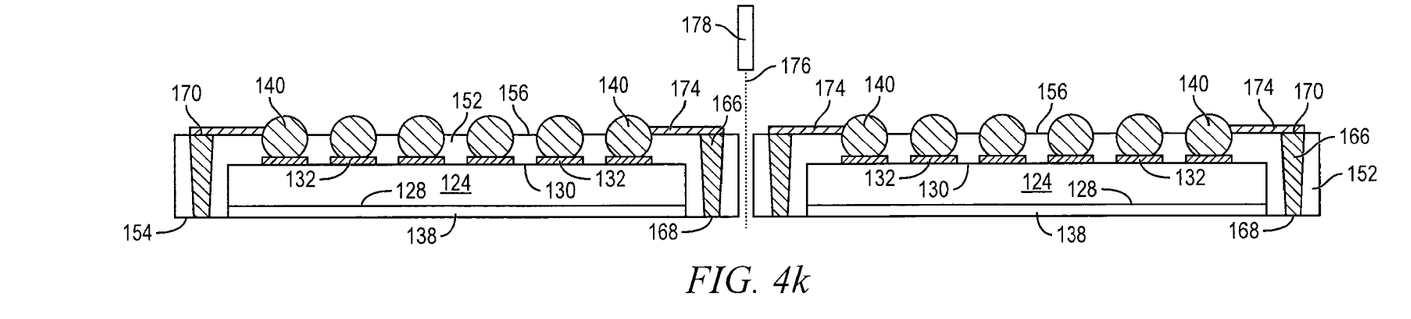

In FIG. 4k, carrier 134 is removed by chemical etching, mechanical peel-off, CMP, mechanical grinding, thermal bake, laser scanning, or wet stripping to expose first surface 168 of conductive vias 166. Additionally, the plurality of semiconductor die 124 is singulated through encapsulant 152 at saw street 176 using a saw blade or laser cutting tool 178. Saw street 176 is in a periphery region around semiconductor die 124 and between conductive via 166.

Figure 4L:
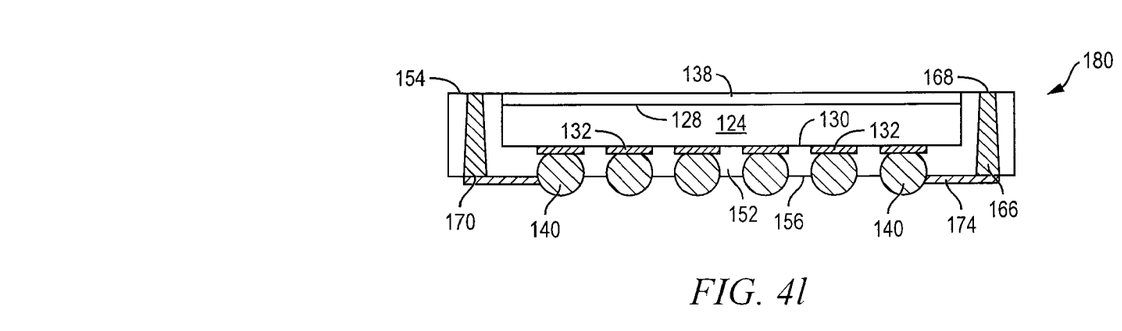

FIG. 4l shows a cross sectional view of a semiconductor die 124 having been singulated through saw street 176 to form a WLCSP 180.

Figure 4M:
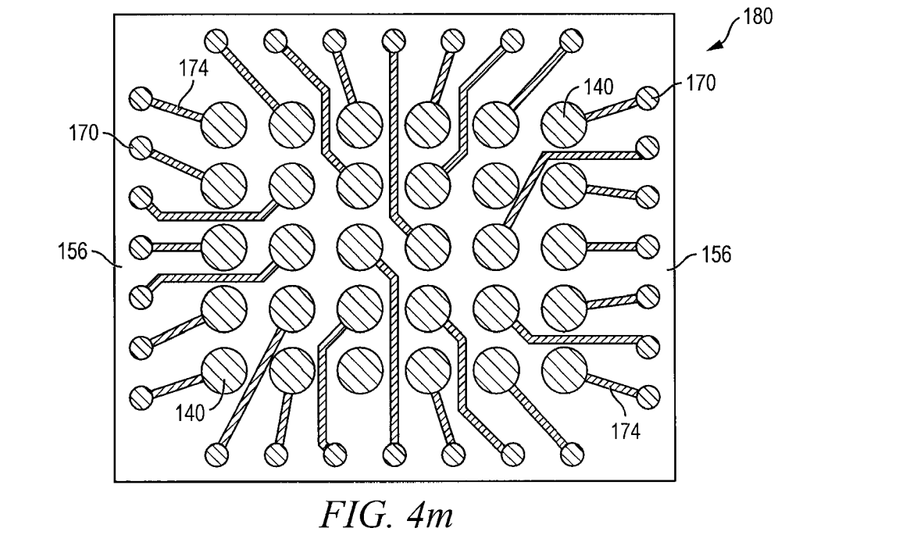

FIG. 4m shows a plan view of WLCSP 180. Second surface 156 of encapsulant 152 exposes a portion of bumps 140 and second surface 170 of conductive vias 166. Conductive layer 174 extends between and electrically connects exposed portions of bumps 140 and second surface 170 of conductive vias 166 to provide through vertical interconnect between opposing surfaces of WLCSP 180.

Accordingly, WLCSP 180 includes conductive layer or RDL 174 formed over encapsulant 152, and conductive via or MLP 166 formed through the encapsulant for vertical interconnect. Back surface 128 of semiconductor die 124 is devoid of encapsulant, which results in an exposed flipchip structure. The exposed back surface 128 reduces overall package height and produces improved thermal characteristics for the package. The use of encapsulant 152 also eliminates the need for an additional underfill step. Opening 146, in which encapsulant 152 is formed, has a width less than 90 um that facilitates advanced nodes. The use of conductive vias 166 provides electrical vertical interconnect to opposing sides of WLCSP 180 and allows for manufacture at the wafer level, unlike conventional multi-stack flipchip designs that include wire bonds. Additionally, by omitting wire bonds in favor of conductive vias 166, the package profile is reduced. By forming conductive vias 166 in encapsulant 152 and not over conductive layer 132, possible damage resulting from forming and plating a conductive via directly on a contact pad of a semiconductor die is avoided. Furthermore, WLCSP 180 facilitates the stacking of a number of similar WLCSPs, or a multi stack with devices including different functions, without limiting the I/O count of the devices within the WLCSP.

Figure 5:
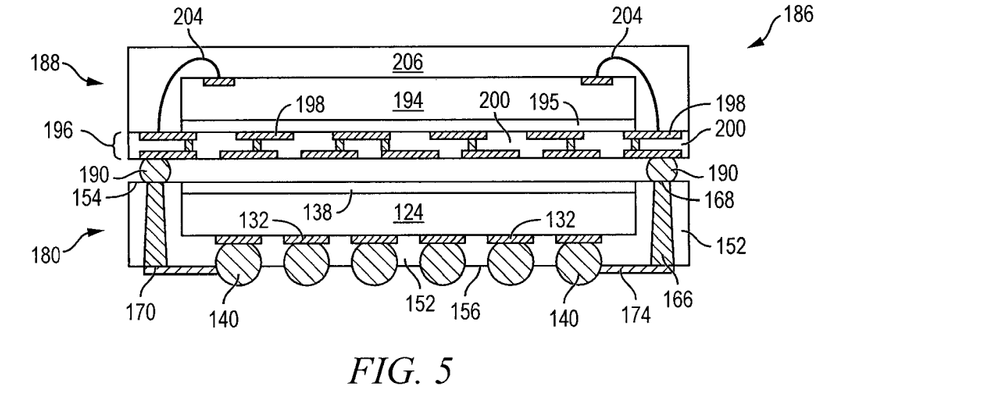
FIG. 5 illustrates an embodiment of a package on package (PoP) WLCSP including a WLCSP with conductive via and an exposed bump.

FIG. 5 shows another embodiment of WLCSP 180, continuing from FIG. 4l. In FIG. 5, WLCSP 180 forms a portion of a larger PoP WLCSP 186. PoP 186 includes a bond wire WLCSP 188 mounted over and electrically connected to WLCSP 180 with bumps 190. Bumps 190 are formed by depositing electrically conductive bump material between first surface 168 of conductive via 166 and WLCSP 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded between first surface 168 of conductive via 166 and WLCSP 188 using a suitable attachment or bonding process. In one embodiment, the bump material is reflowed by heating the material above its melting point to form spherical balls or bumps 190. In some applications, bumps 190 are reflowed a second time to improve electrical contact to first surface 168 of conductive via 166 and WLCSP 188. In one embodiment, bumps 190 are formed over an under bump metallization (UBM) having a wetting layer, barrier layer, and adhesive layer. The bumps can also be compression bonded, and represent one type of interconnect structure that can be formed between first surface 168 of conductive via 166 and WLCSP 188. The interconnect structure can also use bond wires, conductive paste, stud bump, micro bump, or other electrical interconnect.

WLCSP 188 includes a semiconductor die 194 having a substrate with an active region containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within its active surface to implement baseband analog circuits or digital circuits, such as DSP, ASIC, memory, or other signal processing circuit. Semiconductor die 194 can also contain IPDs, such as inductors, capacitors, and resistors, for RF signal processing.

Semiconductor die 194 is mounted over interconnect structure 196 using a die attach adhesive 195. Interconnect structure 196 includes an electrically conductive layer or RDL 198 formed using a patterning and metal deposition process such as sputtering, electrolytic plating, and electroless plating. Conductive layer 198 can be one or more layers of Al, Cu, Sn, Ni, Au, Ag, or other suitable electrically conductive material. Conductive layer 198 is electrically connected to bumps 190 and semiconductor die 194. Other portions of conductive layer 198 can be electrically common or electrically isolated depending on the design and function of semiconductor die 124. Interconnect structure 196 further includes an insulation or passivation layer 200 formed around conductive layer 198 for electrical isolation. The insulation layer 200 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Insulation layer 200 is formed using PVD, CVD, printing, spin coating, spray coating, sintering or thermal oxidation. Portions of insulation layer 200 are removed by an etching process to expose conductive layer 198 for electrical connection to bumps 190 and bond wires 204.

Bond wires 204 are formed between semiconductor die 194 and conductive layer 198 within interconnect structure 196 to electrically connect semiconductor die 194 to bumps 190 and WLCSP 180. Bond wires are a low-cost, stable technology for forming the electrical connection between interconnect structure 196 and semiconductor die 194.

An encapsulant or molding compound 206 is deposited over interconnect structure 196, semiconductor die 194, and around bond wires 204 using a paste printing, compressive molding, transfer molding, liquid encapsulant molding, vacuum lamination, or other suitable applicator. Encapsulant 206 can be polymer composite material, such as epoxy resin with filler, epoxy acrylate with filler, or polymer with proper filler. Encapsulant 206 is non-conductive, provides physical support, and environmentally protects WLCSP 188 from external elements and contaminants.

Figure 6:
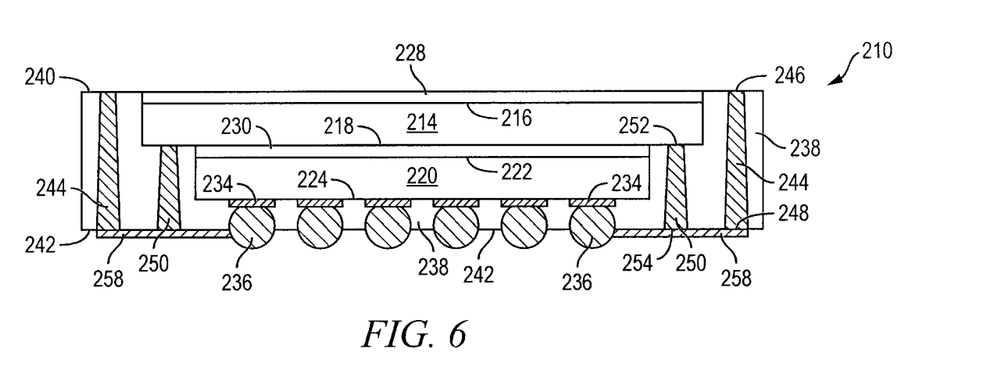
FIG. 6 illustrates an embodiment of a WLCSP with conductive via and an exposed bump including multiple semiconductor die.

FIG. 6 shows another embodiment of a WLCSP including an RDL formed over an encapsulant, and a MLP or conductive via formed through the encapsulant. The MLP provides vertical interconnect and electrically connects to bumps partially exposed from the encapsulant. The RDL contacts a portion of the bumps exposed from the encapsulant.

WLCSP 210 shows a chip stack application including first and second semiconductor die. First semiconductor die 214 has a back surface 216 and active surface 218. Second semiconductor die 220 has a back surface 222 and active surface 224. Active surfaces 218 and 224 contain analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surfaces 218 and 224 to implement analog circuits or digital circuits, such as DSP, ASIC, memory, or other signal processing circuit. Semiconductor die 214 and 220 can also contain IPDs, such as inductors, capacitors, and resistors, for RF signal processing. An interface layer or double-sided tape 228 contacts back surface 216 of the first semiconductor die 214 as an adhesive bonding film or etch-stop layer. Similarly, a die attach adhesive 230 contacts back surface 222 of the second semiconductor die 220.

Within WLCSP 210, the second semiconductor die 220 is mounted to the first semiconductor die 214 with die attach adhesive 230. Back surface 222 of second semiconductor die 220 is mounted to active surface 218 of first semiconductor die 214 with die attach adhesive 230. Because second semiconductor die 220 has an area less than an area of first semiconductor die 214, the second semiconductor die covers less than the entire area of active surface 218 of first semiconductor die 214. Accordingly, a portion of active surface 218 in a periphery of first semiconductor die 214 is exposed with respect to second semiconductor die 220.

An electrically conductive layer 234 is formed over and extends above active surface 224 such that a top surface of conductive layer 234 creates an uneven surface, and has a non-planar topology, with respect to active surface 224. Alternatively, conductive layer 234 is coplanar with active surface 224. Conductive layer 234 is formed using PVD, CVD, electrolytic plating, electroless plating process, or other suitable metal deposition process. Conductive layer 234 can be one or more layers of Al, Cu, Sn, Ni, Au, Ag, or other suitable electrically conductive material. Conductive layer 234 operates as contact pads electrically connected to the circuits on active surface 224.

An electrically conductive bump material is deposited over conductive layer 234 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 234 using a suitable attachment or bonding process. In one embodiment, the bump material is reflowed by heating the material above its melting point to form spherical balls or bumps 236. In some applications, bumps 236 are reflowed a second time to improve electrical contact to conductive layer 234. The bumps can also be compression bonded to conductive layer 234. Bumps 236 represent one type of interconnect structure that can be formed over conductive layer 234. The interconnect structure can also use bond wires, conductive paste, stud bump, micro bump, or other electrical interconnect.

An encapsulant or molding compound 238 is deposited over first semiconductor die 214, and second semiconductor die 220 using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. A first surface 240 of encapsulant 238 contacts sidewalls of first and second semiconductor die 214 and 220, active surfaces 218 and 224, and a portion of conductive layer 234. A second surface 242 of encapsulant 238 is planar, substantially parallel to back surface 216 of first semiconductor die 214, and is formed around a portion of bumps 236. Bumps 236 are partially embedded within encapsulant 238, leaving a portion of the bumps free of the encapsulant. An end portion of the bumps 236 extend above second surface 242 of encapsulant 238. Encapsulant 238 is non-conductive and environmentally protects the semiconductor device from external elements and contaminants.

A plurality of first conductive vias or MLP 244 is formed by first forming a plurality of first vias in encapsulant 238 by DRIE or laser drilling process. The plurality of first vias is formed around the perimeter of first semiconductor die 214, and extends from second surface 242 through encapsulant 238 to first surface 240. The plurality of first vias is then filled with Al, Cu, Sn, Ni, Au, Ag, Ti, W, poly-silicon, or other suitable electrically conductive material using PVD, CVD, electrolytic plating, electroless plating process, or other suitable metal deposition process to form first conductive vias 244. First conductive vias 244 have a first surface 246 substantially coplanar with first surface 240 of encapsulant 238, and a second surface 248 substantially coplanar with second surface 242 of encapsulant 238. Alternatively, a plurality of stud bumps or solder balls can be formed within the plurality of first vias. First conductive vias 244 provide electrical vertical interconnect to opposing sides of WLCSP 210. First conductive vias 244 provide a reduced package profile by omitting wire bonding which tends to increase package profile. Additionally, the formation of first conductive vias 244 in encapsulant 238 and not over conductive layer 234 avoids possible damage resulting from forming and plating a conductive via directly on a contact pad of a semiconductor die.

A plurality of second conductive vias or MLP 250 is formed by first forming a plurality of second vias in encapsulant 238 by DRIE or laser drilling process. The plurality of second vias is formed around the perimeter of second semiconductor die 220, and extends from second surface 242 through encapsulant 238 to active surface 218 of first semiconductor die 214. The plurality of second vias is then filled with Al, Cu, Sn, Ni, Au, Ag, Ti, W, poly-silicon, or other suitable electrically conductive material using PVD, CVD, electrolytic plating, electroless plating process, or other suitable metal deposition process to form second conductive vias 250. Second conductive vias 250 have a first surface 252 that contacts active surface 218 of first semiconductor die 214, and a second surface 254 substantially coplanar with second surface 242 of encapsulant 238. Thus, the plurality of second conductive vias 250 has a length less than a length of the plurality of first conductive vias 244. Alternatively, a plurality of stud bumps or solder balls can be formed within the plurality of second vias. Second conductive vias 250 provide electrical vertical interconnect to first semiconductor die 214. Second conductive vias 250 also provide a reduced package profile by omitting wire bonding which tends to increase package profile.

An electrically conductive layer or RDL 258 is conformally applied over first conductive vias 244, second conductive vias 250, and encapsulant 238, using a patterning and metal deposition process such as PVD, CVD, sputtering, electrolytic plating, and electroless plating. Conductive layer 258 can be one or more layers of Al, Cu, Sn, Ni, Au, Ag, or other suitable electrically conductive material. Conductive layer 258 can be one or more conductive layers including an adhesion layer, barrier layer, and seed or wetting layer. Conductive layer 258 has a thickness less than a distance between second surface 242 of encapsulant 238 and an end portion of bumps 236. Conductive layer 258 electrically connects to second surface 248 of first conductive via 244, second surface 254 of second conductive via 250, and to a portion of bumps 236 free from encapsulant 238, thereby providing electrical interconnect between first semiconductor die 214, second semiconductor die 220, and semiconductor devices external to WLCSP 210.

Figure 7:
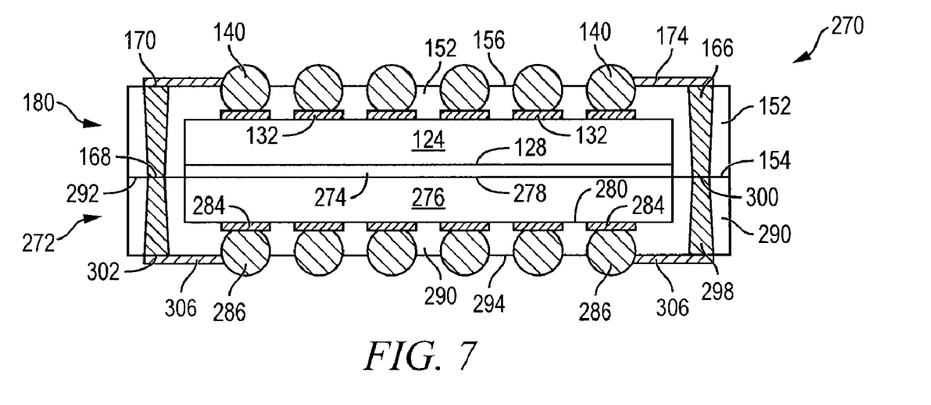
FIG. 7 illustrates an embodiment of WLCSPs with conductive via and an exposed bump stacked back to back to form a PoP WLCSP.

FIG. 7 shows another embodiment of a WLCSP including an RDL formed over an encapsulant, and a MLP or conductive via formed through the encapsulant. The MLP provides vertical interconnect and electrically connects to bumps partially exposed from the encapsulant. The RDL contacts a portion of the bumps exposed from the encapsulant.

PoP WLCSP 270 shows a dual-sided application including a first WLCSP 180, from FIG. 41, mounted to a second WLCSP 272 similar to WLCSP 180. WLCSP 272 includes a semiconductor die 276 having a substrate with an active region containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within its active surface to implement baseband analog circuits or digital circuits, such as DSP, ASIC, memory, or other signal processing circuit. Semiconductor die 276 can also contain IPDs, such as inductors, capacitors, and resistors, for RF signal processing.

Semiconductor die 276 is mounted to semiconductor die 124, back surface 278 to back surface 128, with die attach adhesive 274. Semiconductor die 124 has an area that is substantially equal to an area of semiconductor die 276, such that sidewalls of semiconductor die 124 substantially align with sidewalls of semiconductor die 276. Alternatively, semiconductor die 124 and 276 can have areas of different sizes. For example, semiconductor die 124 can have an area less than an area of semiconductor die 276, such that semiconductor die 124 covers less than the entire area of bottom surface 278 of semiconductor die 276. Alternatively, semiconductor die 124 can have an area greater than an area of semiconductor die 276, such that semiconductor die 276 covers less than the entire area of bottom surface 128 of semiconductor die 124. Regardless of the relative sizing of semiconductor die 124 and 276, the semiconductor die are configured for the subsequent alignment of later formed conductive vias in the periphery of the semiconductor die.

WLCSP 272 includes an electrically conductive layer 284 formed over and extending above active surface 280 such that a top surface of conductive layer 284 creates an uneven surface, and has a non-planar topology, with respect to active surface 280. Alternatively, conductive layer 284 is coplanar with active surface 280. Conductive layer 284 is formed using PVD, CVD, electrolytic plating, electroless plating process, or other suitable metal deposition process. Conductive layer 284 can be one or more layers of Al, Cu, Sn, Ni, Au, Ag, or other suitable electrically conductive material. Conductive layer 284 operates as contact pads electrically connected to the circuits on active surface 280.

An electrically conductive bump material is deposited over conductive layer 284 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 284 using a suitable attachment or bonding process. In one embodiment, the bump material is reflowed by heating the material above its melting point to form spherical balls or bumps 286. In some applications, bumps 286 are reflowed a second time to improve electrical contact to conductive layer 284. The bumps can also be compression bonded to conductive layer 284. Bumps 286 represent one type of interconnect structure that can be formed over conductive layer 284. The interconnect structure can also use bond wires, conductive paste, stud bump, micro bump, or other electrical interconnect.

An encapsulant or molding compound 290 contacts encapsulant 152 of WLCSP 180, and is deposited over semiconductor die 276 using a paste printing, compressive molding, transfer molding, liquid encapsulant molding, vacuum lamination, spin coating, or other suitable applicator. Encapsulant 290 can be polymer composite material, such as epoxy resin with filler, epoxy acrylate with filler, or polymer with proper filler. A first surface 292 of encapsulant 290 contacts sidewalls of semiconductor die 276, active surface 280, and a portion of conductive layer 284. A second surface 294 of encapsulant 290 is planar, substantially parallel to back surface 278 of semiconductor die 276, and is formed around a portion of bumps 286. Bumps 286 are partially embedded within encapsulant 290, leaving a portion of the bumps free of the encapsulant. An end portion of the bumps 286 extend above second surface 294 of encapsulant 290. Encapsulant 290 is non-conductive and environmentally protects semiconductor die 276 from external elements and contaminants.

A plurality of conductive vias or MLP 298 is formed by forming a plurality of vias in encapsulant 290 by DRIE or laser drilling process. The plurality of vias is formed around the perimeter of semiconductor die 276, and extend from second surface 294 through encapsulant 290 to first surface 292. The plurality of vias is then filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive vias 298. Alternatively, a plurality of stud bumps or solder balls can be formed within the plurality of vias to form conductive vias 298. Conductive vias 298 have a first surface 300 that aligns with, and electrically connects to, conductive vias 166 of WLCSP 180. Conductive vias 298 have a second surface 302 that is coplanar with second surface 294 of encapsulant 290. Therefore, conductive vias 298 provide electrical vertical interconnect to opposing sides of WLCSP 272. Conductive vias 298 also provide a reduced package profile by omitting wire bonding which tends to increase package profile. The formation of conductive vias 298 in encapsulant 290 and not over conductive layer 284 avoids possible damage resulting from forming and plating a conductive via directly on a contact pad of a semiconductor die.

An electrically conductive layer or RDL 306 is conformally applied over second surface 302 of conductive vias 298 and second surface 294 of encapsulant 290, using a patterning and metal deposition process such as PVD, CVD, sputtering, electrolytic plating, and electroless plating. Conductive layer 306 can be one or more layers of Al, Cu, Sn, Ni, Au, Ag, or other suitable electrically conductive material. Conductive layer 306 can be one or more conductive layers including an adhesion layer, barrier layer, and seed or wetting layer. Conductive layer 306 has a thickness less than a distance between second surface 294 of encapsulant 290 and an end portion of bumps 286. Conductive layer 306 electrically connects to second surface 302 of conductive via 298 and to a portion of bumps 286 free from encapsulant 290, thereby providing electrical interconnect among semiconductor die 124, semiconductor die 276, and semiconductor devices external to WLCSP 270.

Figure 8:
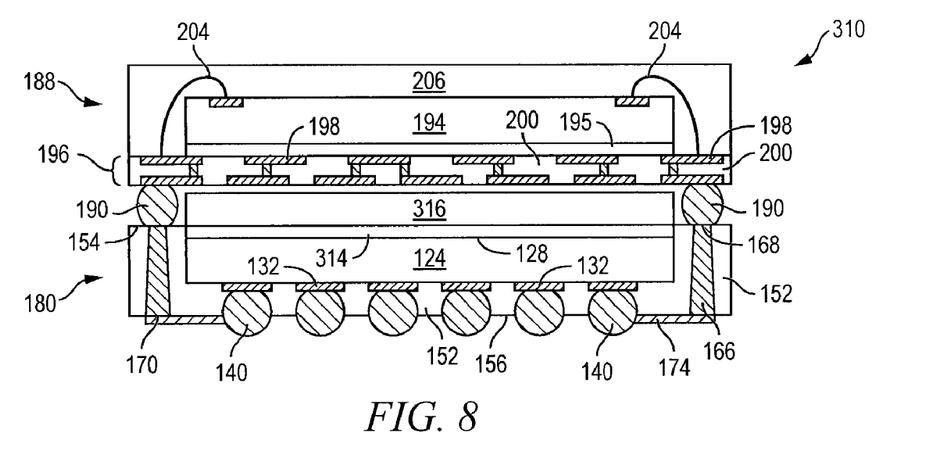
FIG. 8 illustrates an embodiment of a PoP WLCSP including a WLCSP with conductive via and an exposed bump having a heat sink.

FIG. 8 shows another PoP WLCSP 310, similar to PoP 186 from FIG. 5. In FIG. 8, PoP 310 has a thermal interface material (TIM) 314, and heat spreader or heat sink 316. TIM 314 is a thermal epoxy, thermal epoxy resin, or thermal conductive paste that is formed on back surface 128 of semiconductor die 124. Heat spreader 316 is mounted to semiconductor die 124 with TIM 314. Heat spreader 316 can be Cu, Al, or other material with high thermal conductivity. TIM 314 and heat spreader 316 form a thermally conductive path that aids with distribution and dissipation of heat generated by semiconductor die 124 and increases the thermal performance of WLCSP 310.

Figure 9:
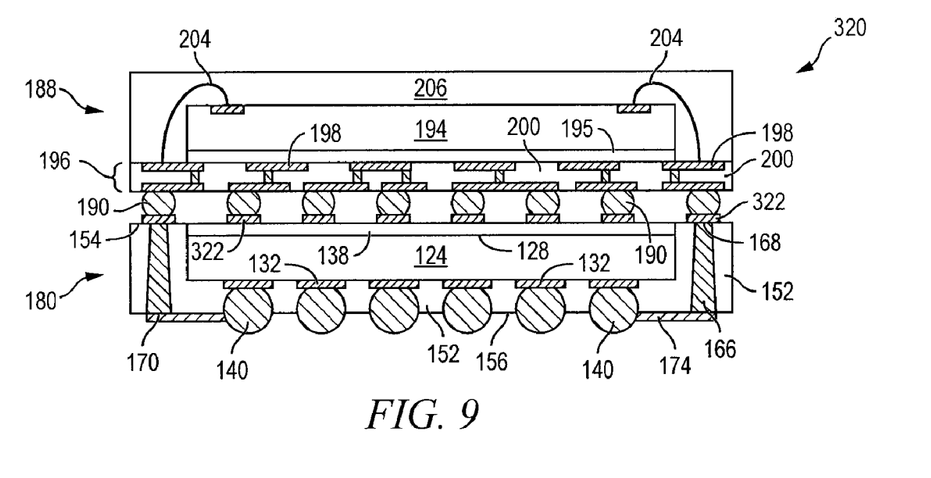
FIG. 9 illustrates an embodiment of a PoP WLCSP including a WLCSP with conductive via and an exposed bump having a redistribution layer (RDL).

FIG. 9 shows another PoP WLCSP 320, similar to PoP 186 from FIG. 5. In FIG. 9, PoP 320 has a conductive layer or RDL 322 that is conformally applied over back surface 128, interface layer 138, encapsulant 152, and conductive vias 166. Conductive layer 322 is formed using a patterning and metal deposition process such as PVD, CVD, sputtering, electrolytic plating, and electroless plating. Conductive layer 322 can be one or more layers of Al, Cu, Sn, Ni, Au, Ag, or other suitable electrically conductive material. Conductive layer 322 can be one or more conductive layers including an adhesion layer, barrier layer, and seed or wetting layer. Conductive layer 322 contacts and electrically connects to first surface 168 of conductive via 166 and to bumps 190. In PoP 320, interconnect structure 196 and bumps 190 form a BGA including multiple interconnect points that are electrically connected to conductive layer 322 according to the electrical design of PoP 320. By electrically connecting bumps 190 to interconnect structure 196 and conductive layer 322, semiconductor die 194 is electrically connected to conductive via 166, conductive layer 174, bumps 140, semiconductor die 124, and semiconductor devices external to WLCSP 320.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier;
    mounting a semiconductor wafer including a plurality of semiconductor die to the carrier with an active surface of the plurality of semiconductor die facing away from the carrier;
    forming a plurality of bumps over the active surface of the plurality of semiconductor die;
    removing a portion of the semiconductor wafer to form an opening between the plurality of semiconductor die;
    depositing an encapsulant over the carrier and plurality of semiconductor die, in the opening, and around the plurality of bumps such that an exposed portion of the plurality of bumps is devoid of encapsulant;
    forming a via through the encapsulant, within the opening, and extending to the carrier;
    depositing a conductive material in the via to form a conductive via;
    forming a conductive layer over the encapsulant and electrically connected to the conductive via and the exposed portion of the plurality of bumps, the conductive layer having a thickness less than a height of the exposed portion of the plurality of bumps; and
    removing the carrier to expose an end of the conductive via.

2. The method of claim 1, wherein a back surface of the plurality of semiconductor die opposite the active surface is devoid of encapsulant, resulting in an exposed flipchip structure.

3. The method of claim 2, further including mounting a heat spreader to the back surface of the plurality of semiconductor die.

4. The method of claim 1, further including forming the conductive via through the encapsulant in a periphery of the plurality of semiconductor die for through vertical interconnect.

5. The method of claim 1, further including stacking a plurality of semiconductor devices to form a package on package wafer level chip scale package.

6. The method of claim 1, wherein depositing the encapsulant around the plurality of bumps eliminates a need for an underfill material.

7. A method of making a semiconductor device, comprising:
provide a carrier;
mounting a semiconductor die to the carrier with an active surface of the semiconductor die facing away from the carrier;
forming a plurality of bumps over the active surface of the semiconductor die;
depositing an encapsulant over the carrier, semiconductor die, and around the plurality of bumps such that an exposed portion of the plurality of bumps is devoid of encapsulant;
forming a via extending through the encapsulant to the carrier;
depositing a conductive material in the via to form a conductive via;
forming a conductive layer over the encapsulant and electrically connected to the conductive via and the exposed portion of the plurality of bumps; and
removing the carrier to expose an end of the conductive via.

8. The method of claim 7, wherein a back surface of the semiconductor die opposite the active surface is devoid of encapsulant, resulting in an exposed flipchip structure.

9. The method of claim 8, further including mounting a heat spreader to the back surface of the semiconductor die.

10. The method of claim 7, further including forming the conductive via through the encapsulant in a periphery of the semiconductor die for through vertical interconnect.

11. The method of claim 7, further including stacking a plurality of semiconductor devices to form a package on package wafer level chip scale package.

12. The method of claim 7, wherein depositing the encapsulant around the plurality of bumps eliminates a need for an underfill material.

13. The method of claim 7, wherein the conductive layer has a thickness less than a height of the exposed portion of the plurality of bumps.

14. A method of making a semiconductor device, comprising:
providing a semiconductor die;
forming a bump over an active surface of the semiconductor die;
depositing an encapsulant over the semiconductor die and around the bump such that an exposed portion of the bump is devoid of encapsulant;
forming a conductive via that extends through the encapsulant; and
forming a conductive layer over the encapsulant and electrically connected to the conductive via and the exposed portion of the bump.

15. The method of claim 14, wherein a back surface of the semiconductor die opposite the active surface is devoid of encapsulant, resulting in an exposed flipchip structure.

16. The method of claim 15, further including mounting a heat spreader to the back surface of the semiconductor die.

17. The method of claim 14, further including forming the conductive via through the encapsulant in a periphery of the semiconductor die for through vertical interconnect.

18. The method of claim 14, further including stacking a plurality of semiconductor devices to form a package on package wafer level chip scale package.

19. The method of claim 14, wherein depositing the encapsulant around the bump eliminates a need for an underfill material.

20. The method of claim 14, wherein the conductive layer has a thickness less than a height of the exposed portion of the bump.

* * * * *